(12) United States Patent
Kung et al.

(10) Patent No.: US 6,743,659 B2
(45) Date of Patent: Jun. 1, 2004

(54) METHOD FOR MANUFACTURING MULTI-LAYER PACKAGE SUBSTRATES

(75) Inventors: Moriss Kung, Hsin Tien (TW); Kwun-Yao Ho, Hsin Tien (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/150,084

(22) Filed: May 20, 2002

(65) Prior Publication Data

US 2003/0113951 A1 Jun. 19, 2003

(30) Foreign Application Priority Data

Dec. 19, 2001 (TW) .................................... 90131489 A

(51) Int. Cl.⁷ ............................................. H01L 21/44
(52) U.S. Cl. ...................... 438/107; 438/108; 438/109; 438/110
(58) Field of Search .................. 438/608, 618–629, 438/107–110; 257/758, 774–778, 782

(56) References Cited

U.S. PATENT DOCUMENTS 5,866,441 A * 2/1999 Pace ........................... 438/108
6,544,815 B2 * 4/2003 Isaak .......................... 438/109
2002/0137255 A1 * 9/2002 Wang et al. ................. 438/107
2002/0146863 A1 * 10/2002 Lin et al. ..................... 438/119

* cited by examiner

*Primary Examiner*—Long Pham
*Assistant Examiner*—Nathan W. Hu
(74) *Attorney, Agent, or Firm*—Troxell Law Office PLLC

(57) ABSTRACT

A method for manufacturing multi-layer package substrates is shown. A substrate with a first side and a second side is first provided, and a layer of release film is formed on the first side and second side of the substrate. After drilling a plurality of through holes on the substrate bonded to the release film and plugging the through holes with a conductive material, the release film is removed. A first copper film is formed on the first and second side of the substrate. First, circuit layer patterns are formed on the first and second side of the substrate through photolithography and etching processes. After coating an build-up layer on the first and second side of the substrate and drilling the build-up layers with a laser to form counter vias on the first side and second side of the substrate, a copper seed layer is formed on the inner surfaces of the counter vias. Second circuit layer patterns are formed on the first side and second side of the substrate. Finally, contact pads are formed on the first side and second side of the substrate.

20 Claims, 16 Drawing Sheets

METHOD FOR MANUFACTURING MULTI-LAYER PACKAGE SUBSTRATES

FIELD OF THE INVENTION

The invention relates to a method for manufacturing multi-layer package substrates and particularly to a method for producing package soft substrates through Roll to Roll, Reel to Reel, or Panel to Panel approaches.

BACKGROUND OF THE INVENTION

Printed circuit boards are composite material substrates coated with single layer or multi-layer circuits. Their main function is to provide support and connections between electronic circuit components such as capacitors, resistors and the like, which are built and assembled on a first layer to construct components for selected functions. Printed circuit boards, depending on the number of circuit layers, can be classified as single-sided, double-sided and multi-sided printed circuit boards. Classified by structural materials, they may be divided into hard substrates and soft substrates. As integrated circuit designs and manufacturing techniques have evolved to encompass deep sub-micron engineering, and computers and other electronic devices have followed a trend towards miniaturization, conventional hard substrates used in integrated circuit packages have become obsolete. They have been replaced by soft substrate PACKAGES in Roll to Roll, Reel to Reel, or Panel to Panel methods.

The soft substrates have flexible characteristics. According to the structural characteristics of conductive line circuits, the soft substrates can be categorized as single-sided, double-sided, single-access, double-access, rigid-flex, and rigidized types.

As previously discussed, the soft substrates made through Roll to Roll or Reel to Reel methods have only one or two layers of circuit layer patterns for use as conductive layers. Although they can meet the requirements of high density and fine line circuits (such as line width and line interval down to 25 microns and output end/input end ranging from 400 to 800 microns), for applications in encased chip packages and high performance output/input, it is necessary to allocate a ground conductive element to avoid high frequency interference and noise. As a result, the effective area for circuit configurations is greatly reduced. Taking into account electric characteristics, the difficulty of circuit configuration for conductive layers that use conventional double-sided circuit layer patterns increases significantly. Hence, the use of multi-layer circuit patterns for conductive layers on soft substrates becomes an unavoidable trend in the development of encased chip packaging.

SUMMARY OF THE INVENTION

The primary object of the invention is to provide a method for the manufacturing of multi-layer package substrates.

Another object of the invention is to provide a method for producing package soft substrates using Roll to Roll, Reel to Reel, or Panel to Panel approaches.

The method for manufacturing multi-layer package substrates according to the invention first provides a substrate having a first side and a second side that are respectively bonded to a release layer. Then the substrate bonded to the release layers is drilled to form a plurality of through holes. Then the through holes are plugged with conductive materials. The release layers are then removed, and a first copper film is formed respectively on the first side and second side of the substrate. After this process, the first copper films are processed through photolithography and etching operations to form first circuit layer patterns on the first and second side of the substrate. Thereafter, the first side and second side of the substrate are respectively coated with an build-up layer, and the build-up layers are drilled by means of a laser to form counter vias on the first side and second side of the substrate. A copper film is formed on the inner surface of the counter vias, and second circuit layer patterns are formed on the first side and second side of the substrate. Finally, a contact pad is formed on the first and second side of the substrate.

In a first embodiment of the invention, the method for forming the second circuit layer patterns is: first, plate the first and second side of the substrate to form a copper layer. Then form a photo resistant layer on the first side and second side of the substrate, and form photo resistant patterns through photolithography processes. Then, plate the first and second layer of the substrate to form a second copper film among the photo resistant patterns, and fill the counter vias. Then, remove the photo resistant patterns, and etch the second copper film to form the second circuit layer pattern.

In a second embodiment of the invention, the method for forming the second circuit layer patterns is: first, plate the first and second side of the substrate to form a second copper film. Then, form a photo resistant layer on the first side and second side of the substrate, and form photo resistant patterns through photolithography processes. Then, etch the second copper film to form the second circuit layer pattern. Finally, the photo resistant patterns are removed.

In a third embodiment of the invention, the method for forming the second circuit layer patterns is: first, form a conductive bonding layer on the first side and second side of the substrate to fill the counter vias. Then, remove bulged objects on the conductive bonding layer by grinding. Then, remove the second release film. Then, plate the first side and second side of the substrate to form a second copper film. Then, form photo resistant patterns through photolithography processes. The second circuit layer patterns are formed through etching processes. Finally, remove the photo resistant patterns.

The foregoing, as well as additional objects, features and advantages of the invention will be more readily apparent from the following detailed description, which is explained with reference to the accompanying drawings.

DESCRIPTION OF THE PREFERRED EMBODIMENTS

The invention aims to provide a method for manufacturing multi-layer PACKAGE substrates and particularly to a method for producing package soft substrates through Roll to Roll, or Reel to Reel, or Panel to Pane approaches.

Refer to FIG. 1 for a first embodiment of the manufacturing method of the invention. First, as shown in FIG. 1A, a substrate (10) is provided which has a first side (10a) and a second side (10b). The techniques provided by the invention, in addition to those adopted for conventional hard substrates, may also be adopted for soft substrates that have a substrate thickness of between 25 and 125 microns.

Figure 1A:
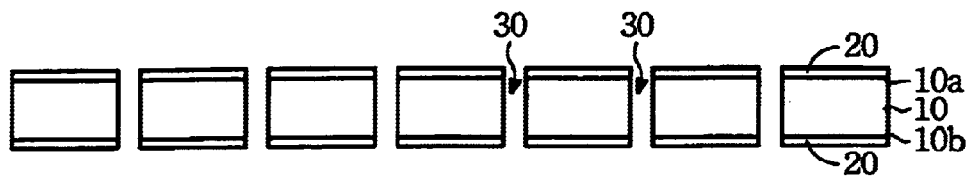
FIGS. 1A through 1X are schematic sectional views of the manufacturing processes of the first embodiment of the invention.

In order to prevent excessive stress during the later plugging process on the substrate (10), the next process is to bond a layer of a first release film (20) on the first side (10a) and second side (10b) of the substrate (10). The first release film (20) is made from an acrylic resin and PET that has an affinity property with substrate and can be easily separated while peeling off and a thickness of between 10 and 20 microns. Then, the substrate (10) bonded to the first release film (20) is drilled to form a plurality of through holes (30) that have diameters of between 20 and 70 microns, as shown in FIG. 1A.

Figure 1B:
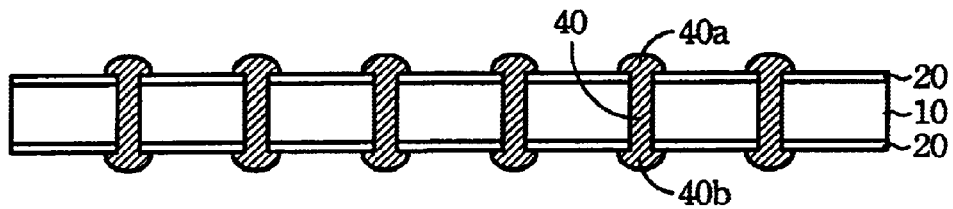
Figure 1C:
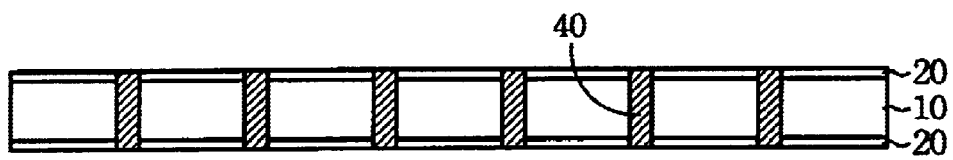

Referring to FIG. 1B, the through holes (30) are plugged with a conductive material (40). The conductive material (40), in addition to filling the through holes (30), also forms bulged objects (40a) during the plugging process, as shown in FIG. 1B. The bulged objects (40a) are removed before the conductive material (40) is cured and hardened, as shown in FIG. 1C. During the plugging process, the substrate (10) is protected by the first release film (20) and the bulged objects (40a) may be easily removed. Therefore, not only the consumption of conductive materials decreases, stress that might otherwise incur to the substrate may also be prevented. As a result, the possibility of the substrate (10) incurring fractures during plugging process can be greatly reduced, and the production yield can be increased.

Figure 1D:
Figure 1E:
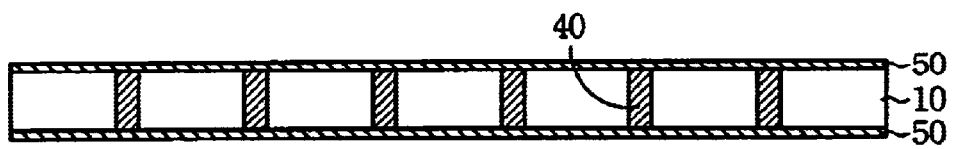

Referring to FIG. 1D, after the first release film (20) is removed, a first copper film (50) is formed on the first side (10a) and second side (10b) of the substrate (10), as shown in FIG. 1E.

Figure 1F:
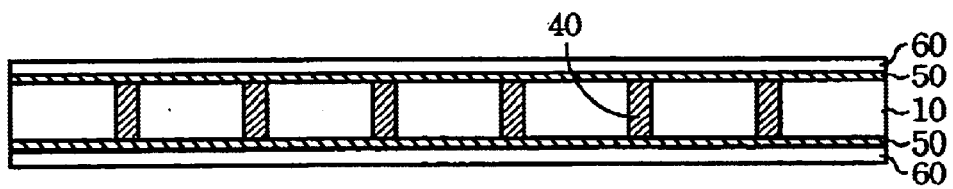
Figure 1G:
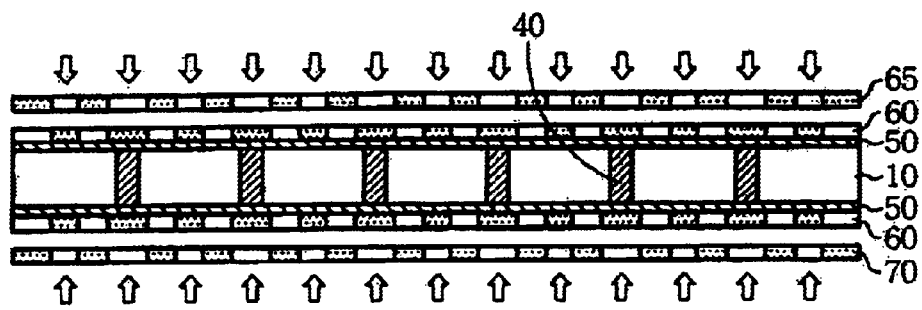
Figure 1H:
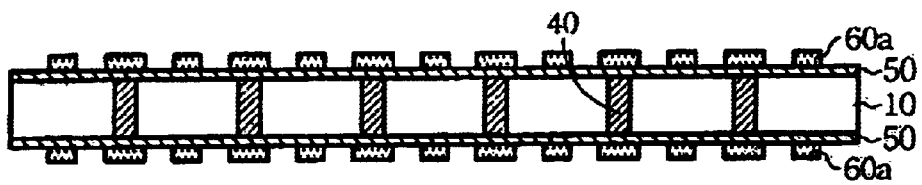
Figure 1I:
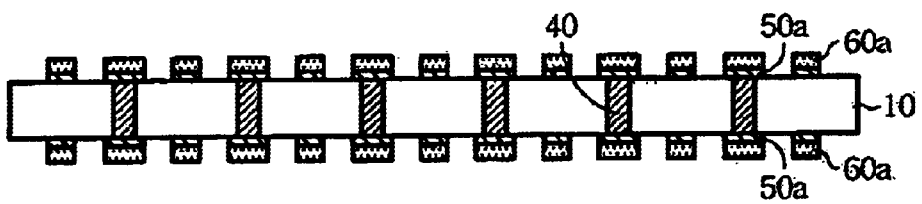
Figure 1J:
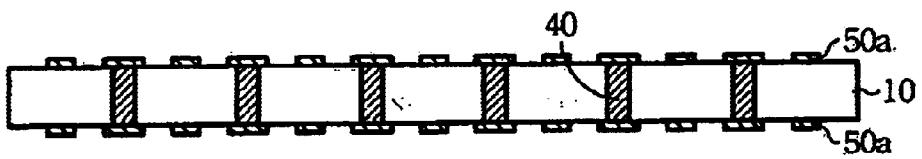

Refer then to FIGS. 1F through 1J for illustrations of the photolithography and etching processes done to the first copper films (50) on the first side (10a) and second side (10b) of the substrate (10) to form a first circuit layer. First, as shown in FIG. 1F, a photo resistant layer (60) is coated on the surfaces of the first copper film (50), which covers the first side (10a) and second side (10b) of the substrate (10). Then a photo mask (65) is used to perform exposure operations in the photolithography processes, as shown in FIG. 1G. Then a chemical developing solution is utilized to perform development operations in the photolithography process, as shown in FIG. 1H, to form photo resistant patterns (60a) of a first circuit layer. An etching process is performed through the photo resistant patterns (60a) to form a plurality of first circuit layer patterns (50a) on the first side (10a) and second side (10b) of the substrate (10), as shown in FIG. 1I. Thereafter, the photo resistant patterns (60a) are removed, as shown in FIG. 1J.

Figure 1K:
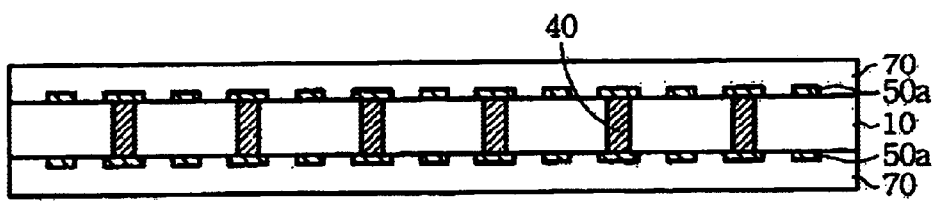

Referring to FIG. 1K, an build-up layer (70) is then coated on the first side (10a) and second side (10b) of the substrate (10). The build-up layers (70) are made from Thermal Plastic Polyimide (TPI).

Figure 1L:
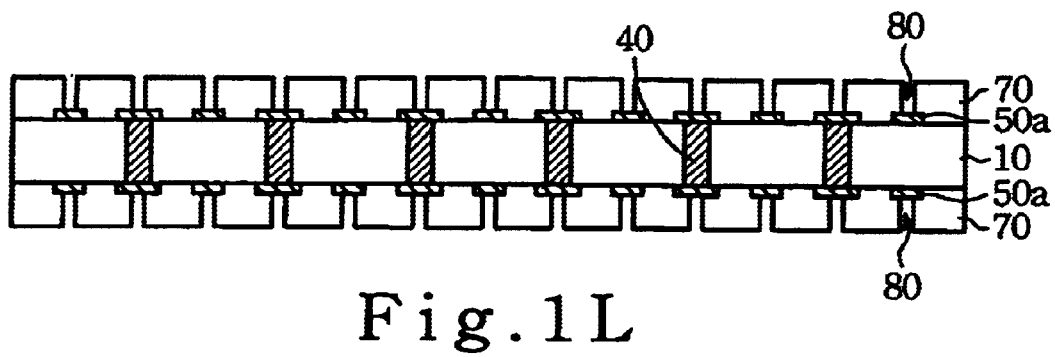
Figure 1M:
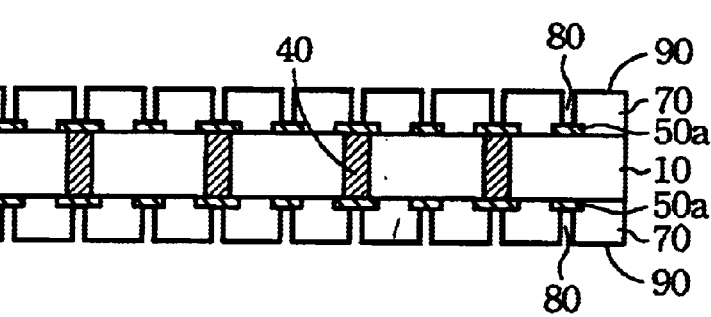

Then, the build-up layers (70) that are now coated on the first side (10a) and second side (10b) of the substrate (10) are drilled by means of laser to form a plurality of counter vias (80). Each of the counter vias (80) has one of the first circuit layer patterns (50a) exposed therein, as shown in FIG. 1L. As shown in FIG. 1M, a copper seed layer (90) is formed on the inner surfaces of the counter vias (80), the surfaces of the first circuit layer patterns (50a) and the surfaces of the build-up layer (70) through chemical CU plating or sputtering techniques.

Figure 1N:
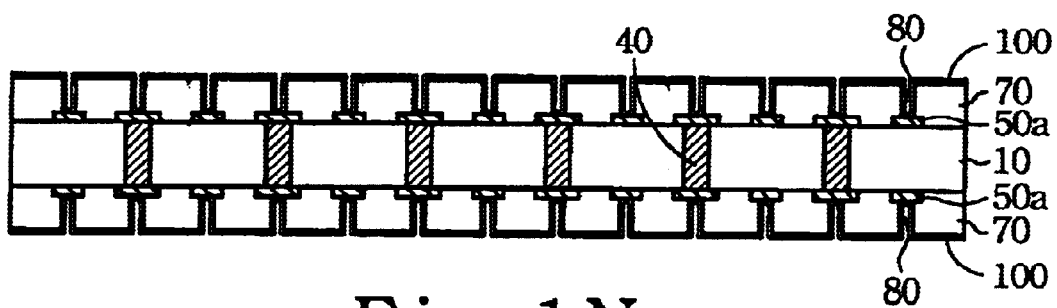
Figure 1O:
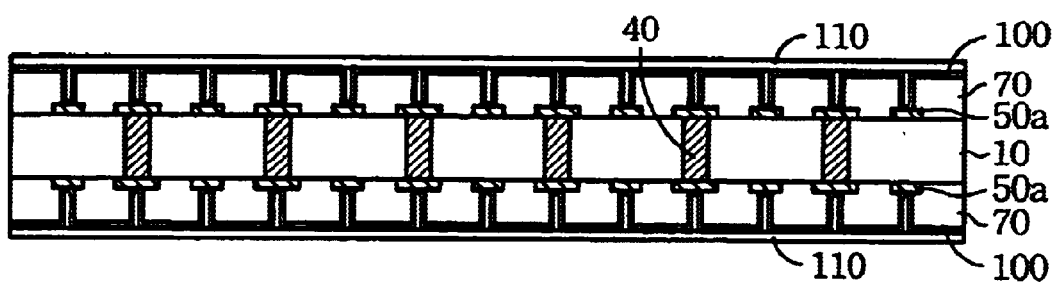
Figure 1P:
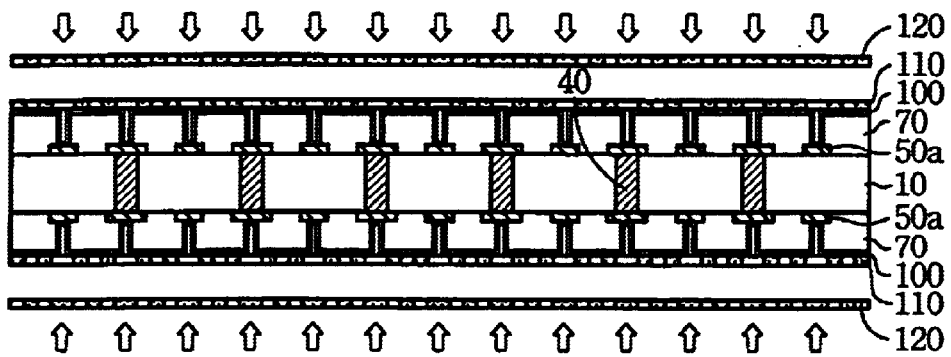
Figure 1Q:
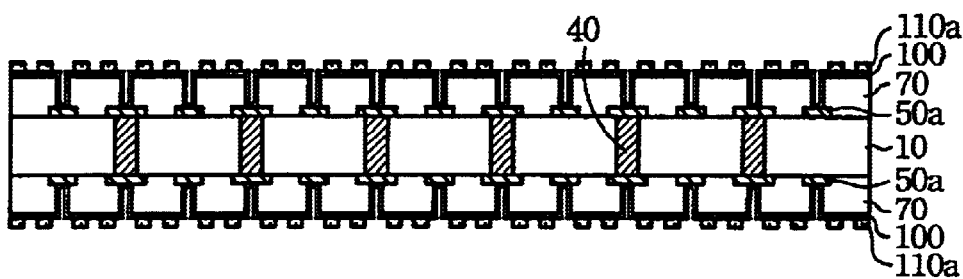

Refer to FIGS. 1N through 1T for the processes necessary for forming a second circuit layer on the first side(10a) and second side (10b) of the substrate (10). First, as shown in FIG. 1N, coat, through a plating process, a copper layer (100) on the surfaces of the copper seed layer (90) laid on the first side (10a) and the second side (10b) of the substrate (10). Then, as shown in FIG. 10, a photo resistant layer (110) is formed on the copper layer (100) of the first side (10a) and second side (10b) of the substrate (10). After that, a photo mask (120) is used to perform exposure operations during the photolithography process, as shown in FIG. 1P, and a chemical developing solution is applied to perform development operations during the photolithography process, as shown in FIG. 1Q, to form photo resistant patterns (110a) for a second circuit layer, as shown in FIG. 1Q.

Figure 1R:
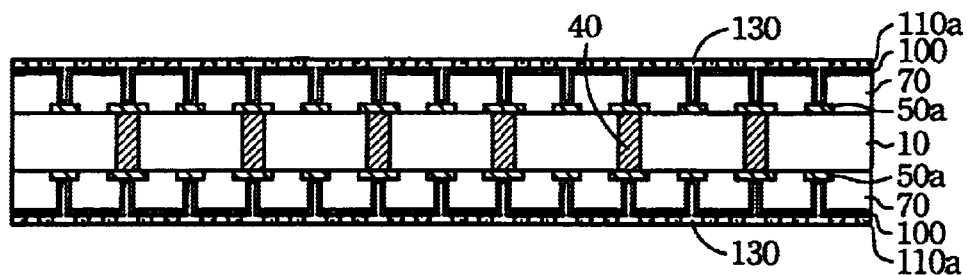
Figure 1S:
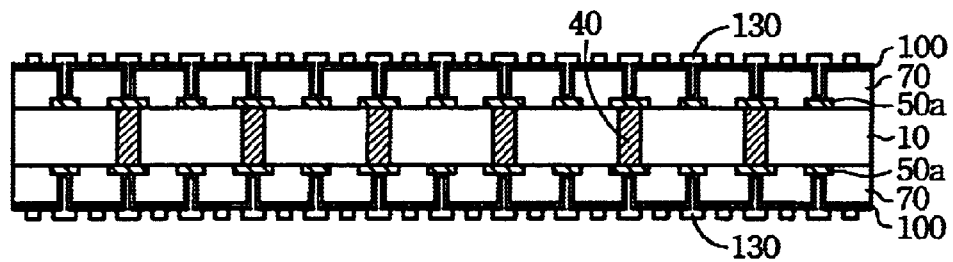
Figure 1T:
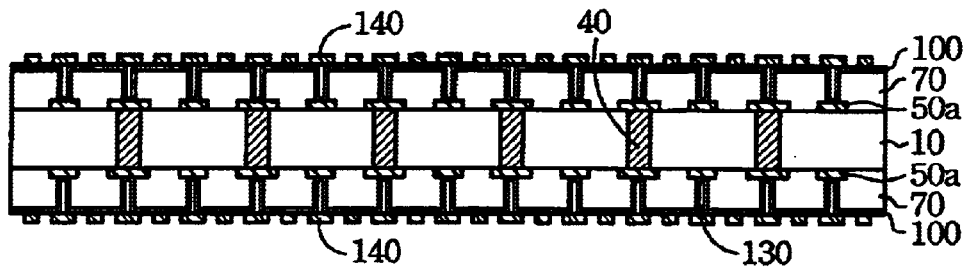

Referring to FIG. 1R, through plating processes, form a second copper film (130) among the photo resistant patterns (110a) on the substrate (10), and fill the counter vias (80) with the second copper film (130). Afterward, as shown in FIG. 1S, the photo resistant patterns (110a) are removed, and the second copper film (130) is etched to form second circuit layer patterns (140), as shown in FIG. 1T.

Figure 1U:
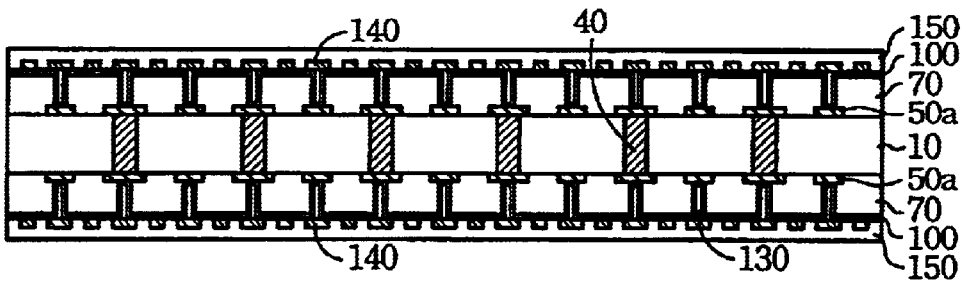
Figure 1V:
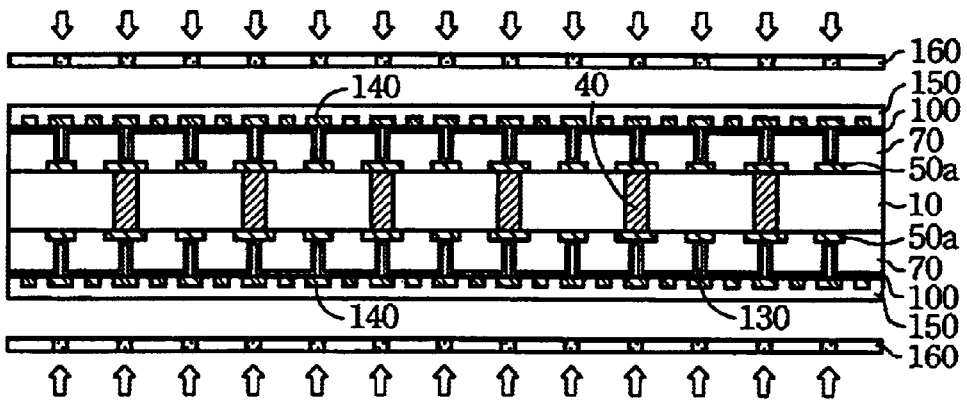
Figure 1W:
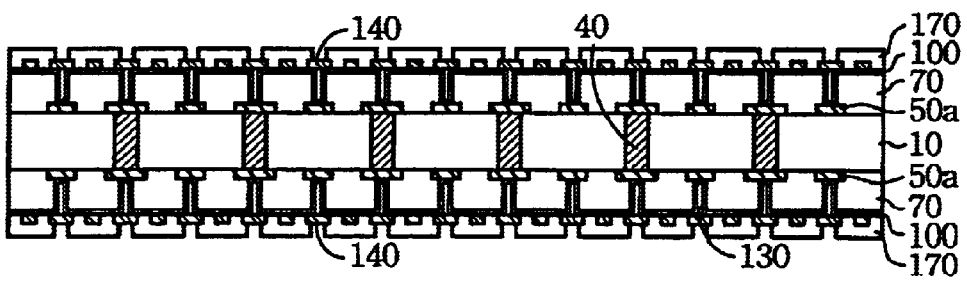
Figure 1X:
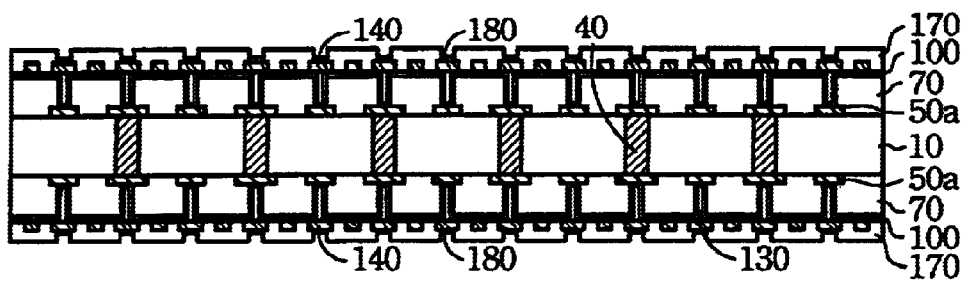

Refer to FIGS. 1U through 1X for the manufacturing processes necessary for forming contact pads on the first side (10a) and second side (10b) of the substrate (10). First, as shown in FIG. 1U, a solder mask (150) is formed on the copper layer (100) of the first side (10a) and second side (10b) of the substrate (10) and second circuit layer patterns (140). A photo mask (160) is used to perform exposure operations during the photolithography processes, as shown in FIG. 1V, and a chemical developing solution is used to perform development operations during the photolithography processes, as shown in FIG. 1W, to form contact pad patterns (170) that expose a portion of the second circuit layer patterns (140). Finally, plate the exposed second circuit layer patterns (140) with a nickel/gold alloy to form contact pads (180), as shown in FIG. 1X. The manufacturing processes of the first embodiment of the invention are now complete.

Refer to FIG. 2 for a second embodiment of the manufacturing method of the invention. First, in FIG. 2A, a substrate (10) is provided which has a first side (10a) and a second side (10b). The techniques provided by the invention, in addition to those adopted for conventional hard substrates, may also be adopted for soft substrates that have a substrate thickness of between 25 and 125 microns.

Figure 2A:
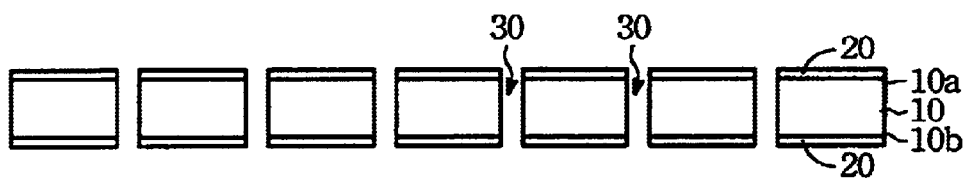
FIGS. 2A through 2W are schematic sectional views of the manufacturing processes of the second embodiment of the invention.

In order to prevent the incurring of excessive stress during the later plugging process on the substrate (10), the next process is to bond a layer of a first release film (20) on the first side (10a) and second side (10b) of the substrate (10). The first release film (20) is made from an acrylic resin that has an affinity property and has a thickness of between 10 20 microns. The substrate (10) bonded to the first release film (20) is then drilled to form a plurality of through holes (30) that have diameters between 20 and 70 microns, as shown in FIG. 2A.

Figure 2B:
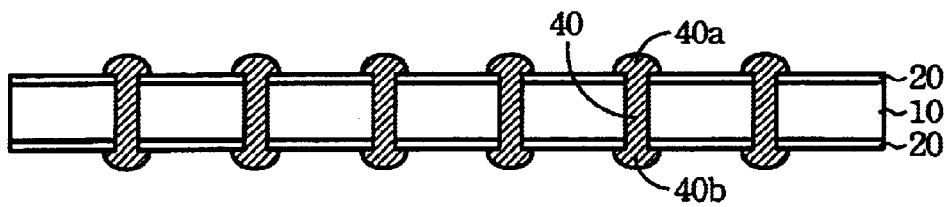
Figure 2C:

Referring to FIG. 2B, the through holes (30) are plugged with a conductive material (40). Besides filling the through holes (30), the conductive material (40) also forms bulged objects (40a) during plugging process, as shown in FIG. 2B. Then the bulged objects (40a) are removed before the conductive material (40) is cured and hardened, as shown in FIG. 2C. The substrate (10) is protected by the first release film (20) during the plugging process release and the bulged objects (40a) may be easily removed. Therefore, not only the consumption of conductive material decreases, stress that might otherwise incur to the substrate (10) may also be prevented. As a result, the possibility of incurring fractures to the substrate (10) during plugging can be greatly reduced, and the production yield can be increased.

Figure 2D:
Figure 2E:
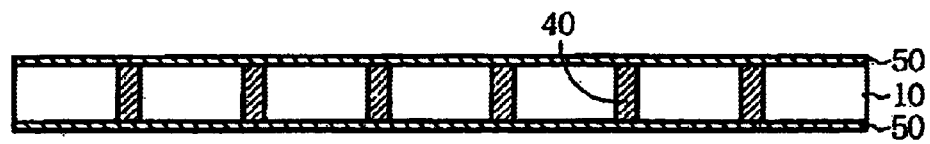

Referring to FIG. 2D, after the first release film (20) is removed, a first copper film (50) is formed on the first side (10a) and second side (10b) of the substrate (10), as shown in FIG. 2E.

Figure 2F:
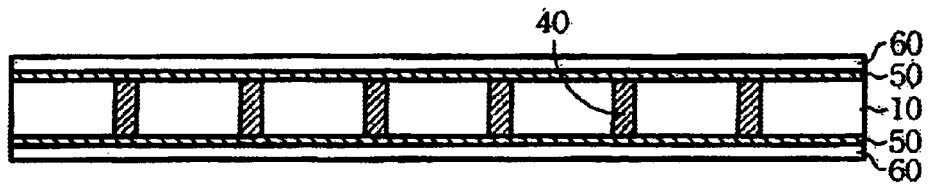
Figure 2G:
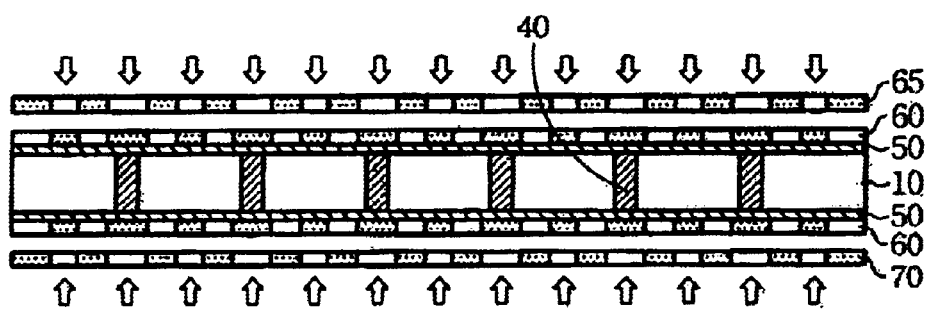
Figure 2H:
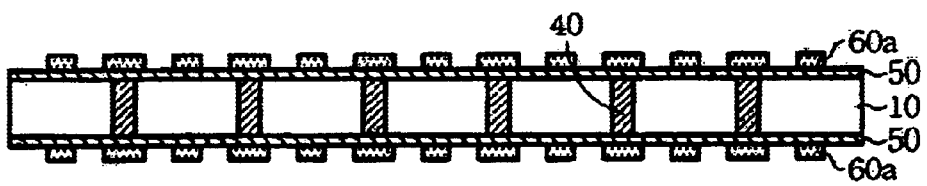
Figure 2I:
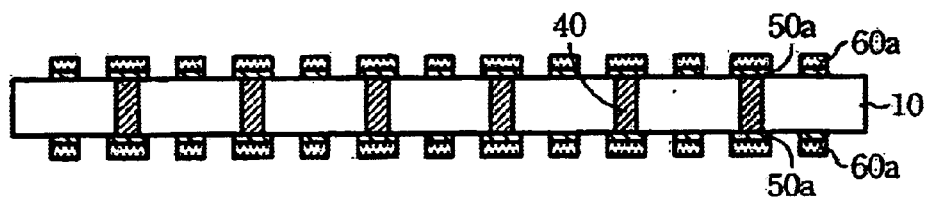
Figure 2J:
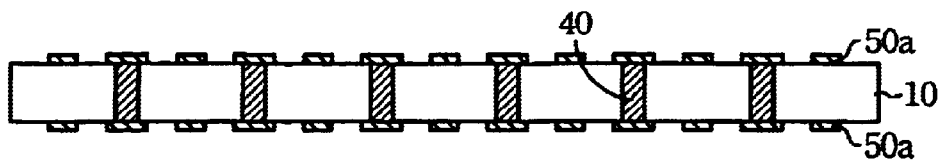

Refer to FIGS. 2F through 2J, photolithography and etching processes are done on the first copper films (50) on the first side (10a) and second side (10b) of the substrate (10) to form a first circuit layer. First, as shown in FIG. 2F, a photo resistant layer (60) is coated on the surfaces of the first copper film (50) covering the first side (10a) and second side (10b) of the substrate (10). A photo mask (65) is used to perform exposure operations during the photolithography processes, as shown in FIG. 2G. A chemical developing solution is then used to perform development operations during the photolithography processes, as shown in FIG. 2H to form photo resistant patterns (60a) of a first circuit layer. After that, an etching process is performed through the photo resistant patterns (60a) to form a plurality of first circuit layer patterns (50a) on the first side (10a) and second side (10b) of the substrate (10), as shown in FIG. 2I. Next, the photo resistant patterns (60a) are removed, as shown in FIG. 2J.

Figure 2K:
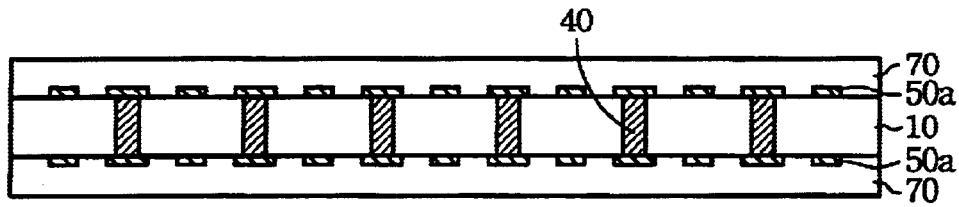

Thereafter, referring to FIG. 2K, an build-up layer (70) is coated on the first side (10a) and second side (10b) of the substrate (10). The build-up layers (70) are made from Thermal Plastic Polyimide (TPI).

Figure 2L:
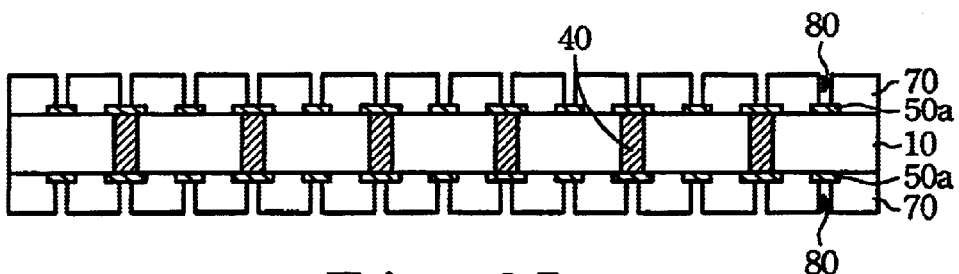
Figure 2M:
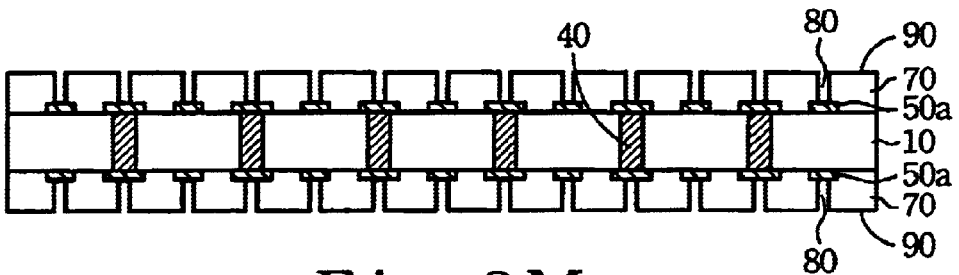

The build-up layers (70) are then coated on the first side (10a) and second side (10b) of the substrate (10) and are drilled by means of a laser to form a plurality of counter vias (80). Each of the counter vias (80) has one of the first circuit layer patterns (50a) exposed therein, as shown in FIG. 2L. A copper seed layer (90) is formed on the inner surfaces of the counter vias (80), the surfaces of the first circuit layer patterns (50a) and the surfaces of the build-up layers (70) through chemical CU plating or sputtering techniques to form a copper seed layer (90), as shown in FIG. 2M.

Figure 2N:
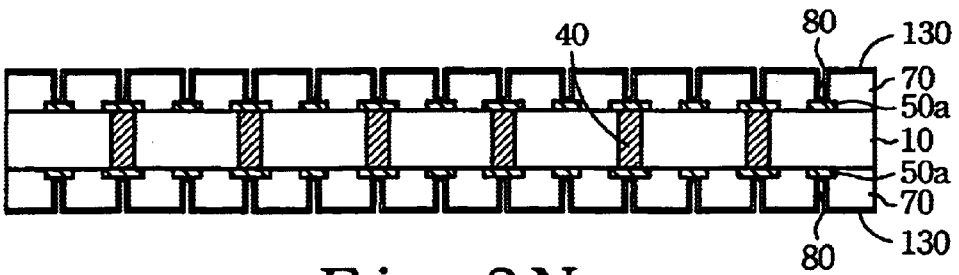

Refer to FIGS. 2N through 2S for the processes of forming a second circuit layer on the first side (10a) and second side (10b) of the substrate (10). First, as shown in FIG. 2N, coat through a plating process to form a second copper film (130) on the surfaces of the copper seed layer (90), covering the first side (10a) and second side (10b) of the substrate (10). The second copper film (130) has a thickness of between 10 and 20 microns, preferably 15 microns.

Figure 2O:
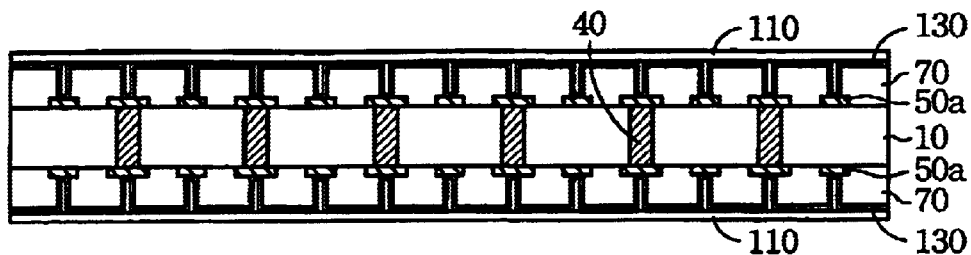
Figure 2P:
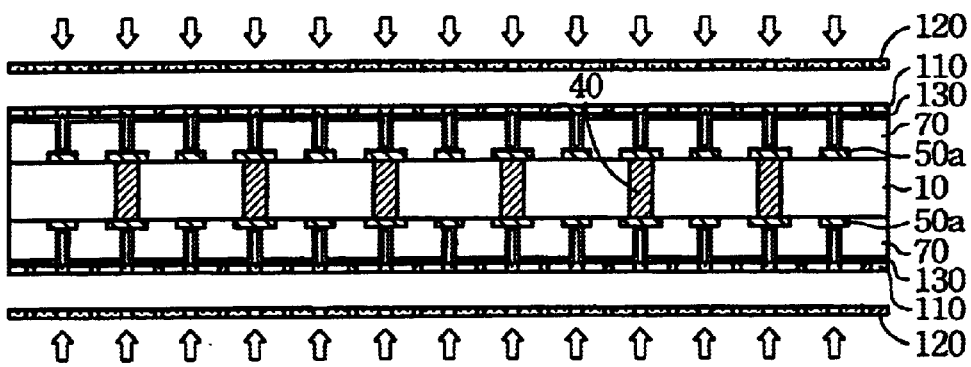
Figure 2Q:
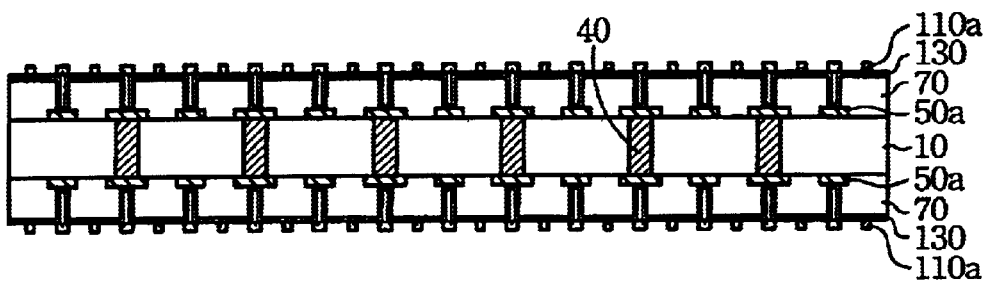
Figure 2R:
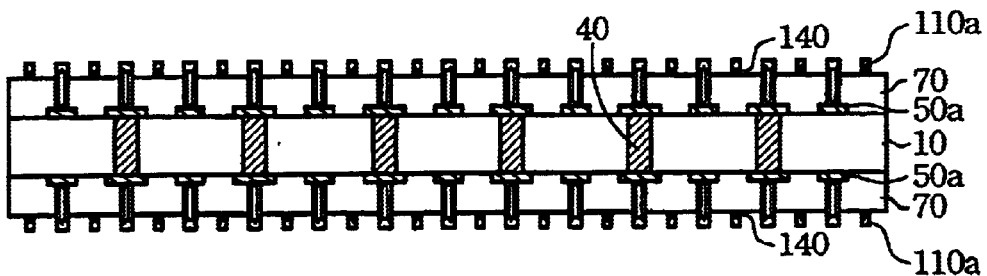
Figure 2S:
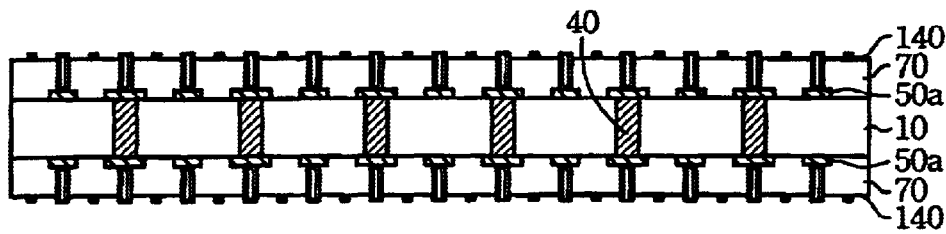

Then, as shown in FIG. 2O, a photo resistant layer (110) is formed on the second copper film (130) of the first side (10a) and second side (10b) of the substrate (10). A photo mask (120) is used to perform exposure operations during the photolithography processes, as shown in FIG. 2P, and a chemical developing solution is applied to perform development operations during the photolithography processes, as shown in FIG. 2Q, to form a photo resistant pattern (110a) for a second circuit layer, as shown in FIG. 2Q. Referring to FIG. 2R, the second copper film (130) is etched to form second circuit layer patterns (140). Finally, the photo resistant pattern (110a) is removed, as shown in FIG. 2S.

Figure 2T:
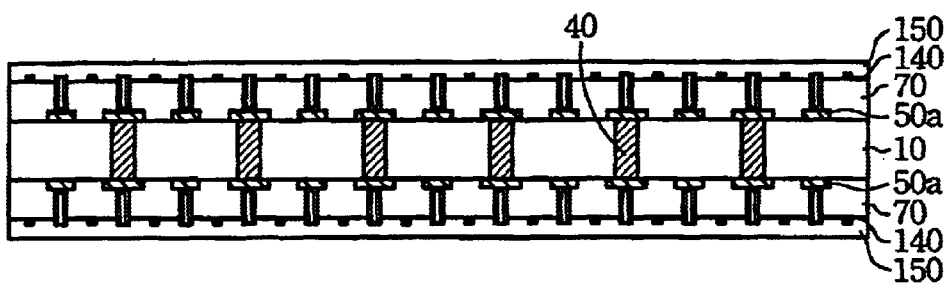
Figure 2U:
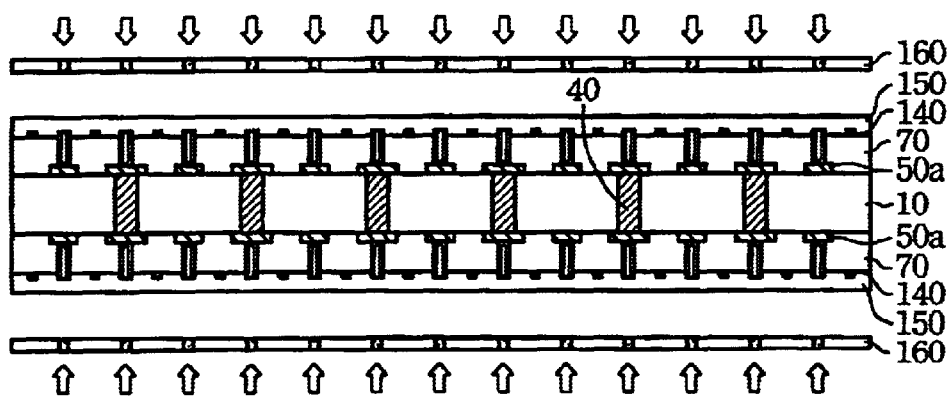
Figure 2V:
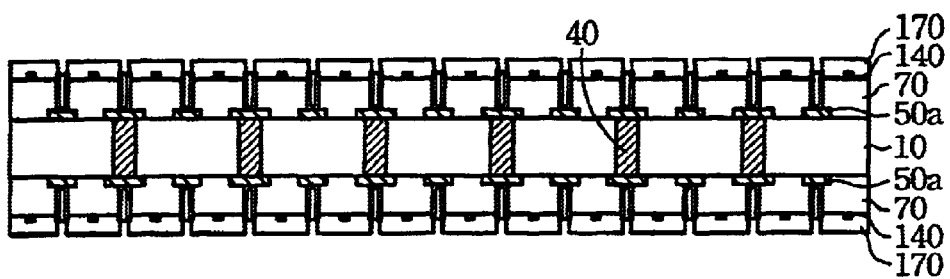
Figure 2W:
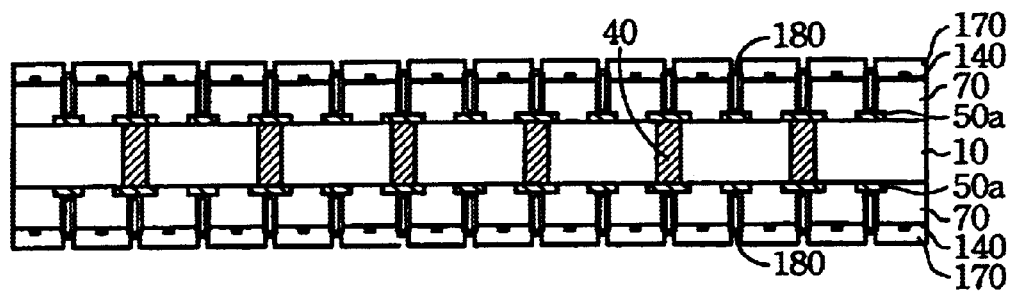

Refer to FIGS. 2T through 2W for the manufacturing processes necessary for forming contact pads on the first side (10a) and second side (10b) of the substrate (10). First, as shown in FIG. 2T, a solder mask (150) is formed on the second copper film (130) of the first side (10a) and second side (10b) of the substrate (10) and second circuit layer patterns (140). A photo mask (160) is then applied to perform exposure operations during the photolithography processes, as shown in FIG. 2U, and as shown in FIG. 2V, a chemical developing solution is used to perform development operations during the photolithography processes to form contact pad patterns (170) that expose a portion of the second circuit layer patterns (140). Finally, plate the exposed second circuit layer patterns (140) with a nickel/gold alloy to form contact pads (180), as shown in FIG. 2W. The manufacturing processes of the second embodiment of the invention is now complete.

Refer to FIG. 3 for a third embodiment of the manufacturing method of the invention. First, as shown in FIG. 3A, a substrate (10) is provided which has a first side (10a) and a second side (10b). The techniques provided by the invention, in addition to those adopted for conventional hard substrates, may also be adopted for soft substrates that have substrate thickness of between 25 and 125 microns.

Figure 3A:
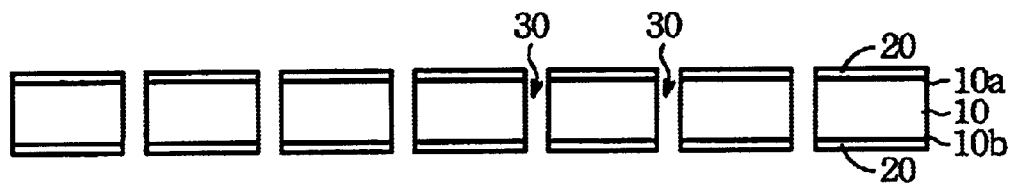
FIGS. 3A through 3Z and 3AA are schematic sectional views of the manufacturing processes of the third embodiment of the invention.

In order to prevent excessive stress from incurring during the later plugging process on the substrate (10), the next process is to bond a layer of a first release film (20) on the first side (10a) and second side (10b) of the substrate (10). The first release film (20) is made from an acrylic resin that has an affinity property and a thickness of between 10 and 20 microns. The substrate (10) bonded to the first release film (20) is then drilled to form a plurality of through holes (30) that have diameters of between 20 and 70 microns, as shown in FIG. 3A.

Figure 3B:
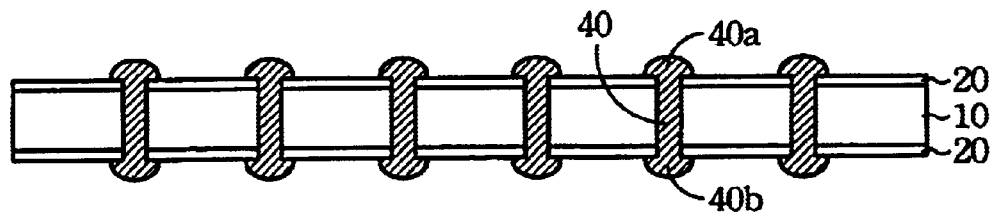
Figure 3C:

Referring to FIG. 3B, the through holes (30) are plugged with a conductive material (40). The conductive material (40), besides filling the through holes (30), also forms bulged objects (40a) during the plugging process, as shown in FIG. 3B. The bulged objects (40a) are then removed before the conductive material (40) is cured and hardened, as shown in FIG. 3C. During the plugging process, the substrate (10) is protected by the first release film (20), thus the bulged objects (40a) may be easily removed. Therefore, not only the consumption of conductive material decreases, stress that might otherwise incur to the substrate (10) may also be prevented. As a result, the possibility of incurring fractures to the substrate (10) during plugging can be greatly reduced, and the production yield can be increased.

Figure 3D:
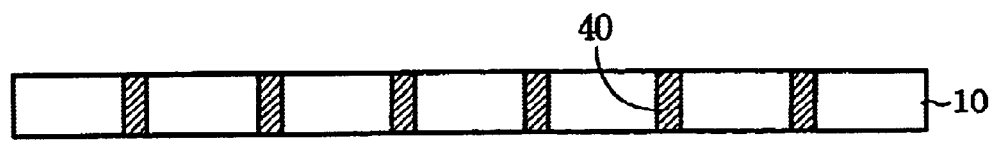
Figure 3E:
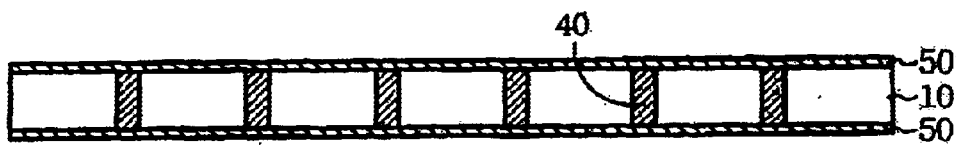

Referring to FIG. 3D, after the first release film (20) is removed, a first copper film (50) is formed on the first side (10a) and second side (10b) of the substrate (10), as shown in FIG. 3E.

Figure 3F:
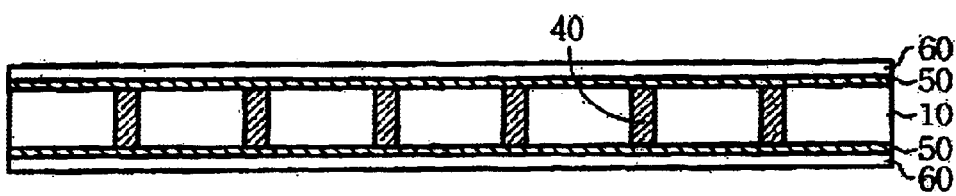
Figure 3G:
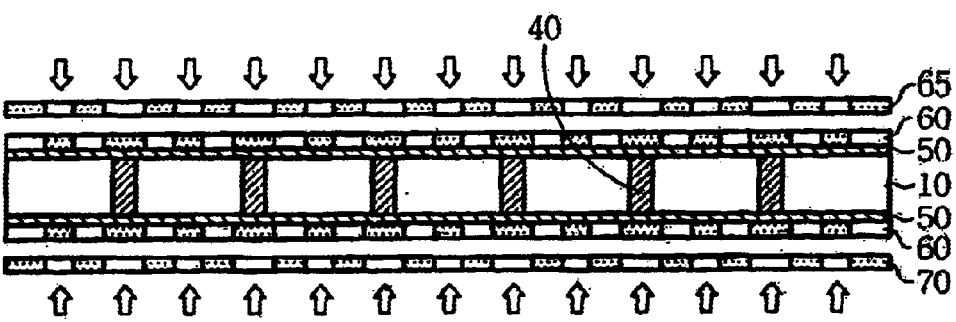
Figure 3H:
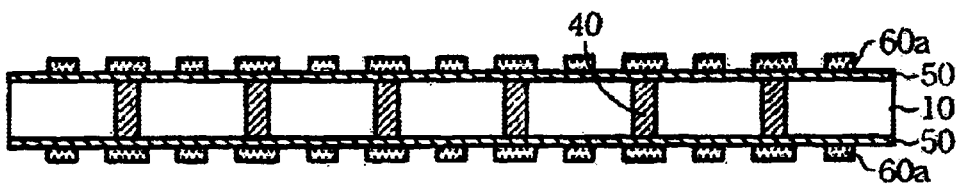
Figure 3I:
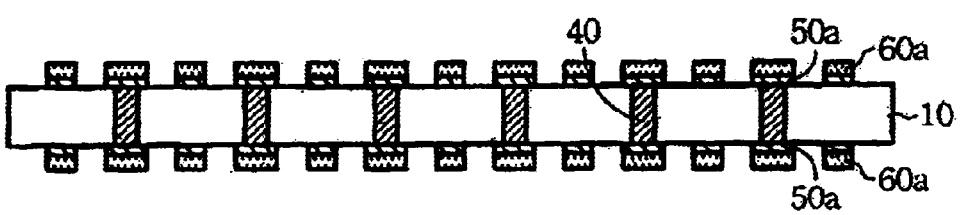
Figure 3J:
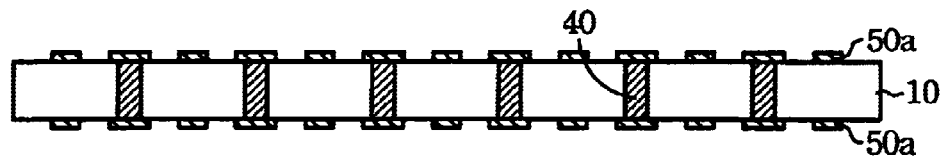

Refer to FIGS. 3F through 3J for the photolithography and etching processes done on the first copper films (50) on the first side (10a) and second side (10b) of the substrate (10) to form a first circuit layer. As shown in FIG. 3F, a layer of photo resistant (60) is coated on surfaces of the first copper films (50) covering the first side (10a) and second side (10b) of the substrate (10). A photo mask (65) is used to perform exposure operations during the photolithography processes, as shown in FIG. 3G. A chemical developing solution is then applied to perform development operations during the photolithography processes, as shown in FIG. 3H, to form photo resistant patterns (60a) of a first circuit layer. An etching process is performed through the photo resistant patterns (60a) to form a plurality of first circuit layer patterns (50a) on the first side (10a) and second side (10b) of the substrate (10), as shown in FIG. 3I. Next, the photo resistant patterns (60a) are removed, as shown in FIG. 3J.

Figure 3K:
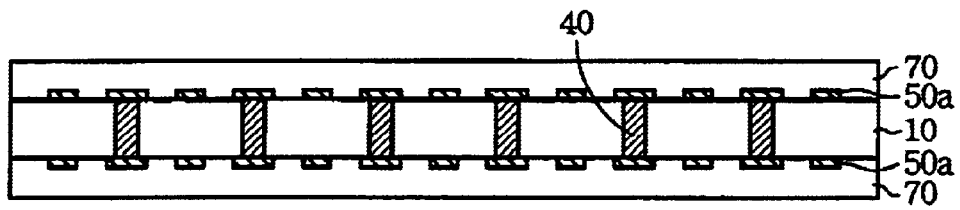
Figure 3L:
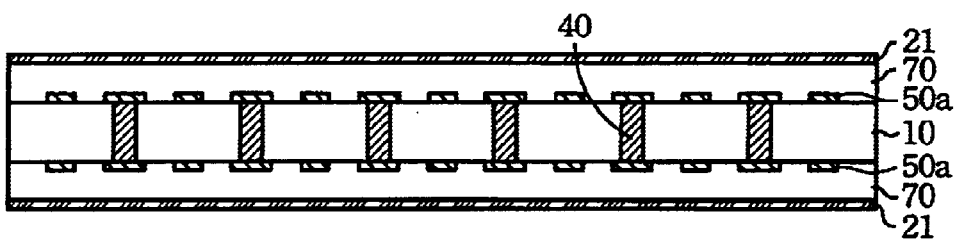

Thereafter, referring to FIG. 3K, an build-up layer (70) is coated on the first side (10a) and second side (10b) of the substrate (10). The build-up layers (70) are made from Thermal Plastic Polyimide (TPI). Then a second release layer (21) is bonded to the build-up layers (70) on the first side (10a) and second side (10b) of the substrate (10), as shown in FIG. 3L, with a thickness of between 10 and 20 microns.

Figure 3M:
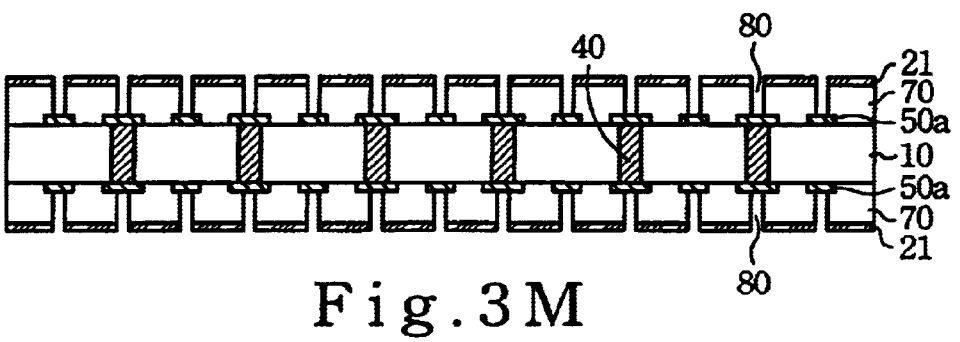
Figure 3N:
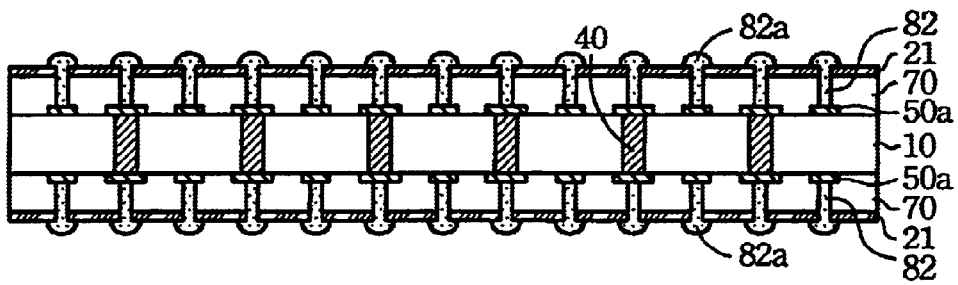
Figure 3O:
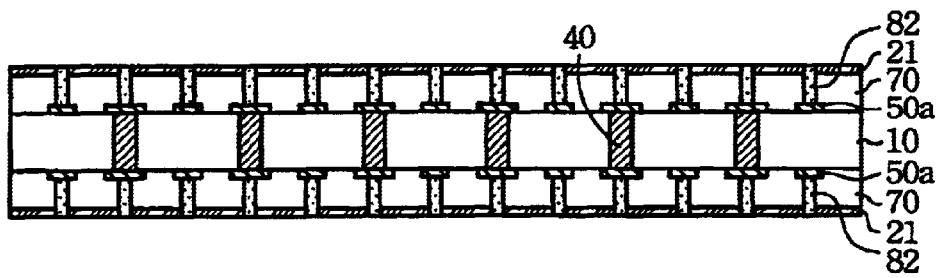
Figure 3P:
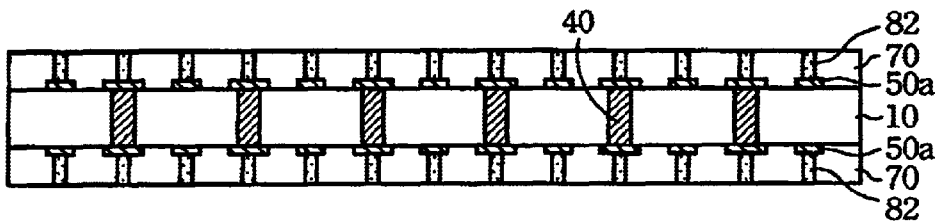

The build-up layers (70) are then coated on the first side (10a) and second side (10b) of the substrate (10) and are drilled by means of a laser to form a plurality of counter vias (80). Each of the counter vias (80) has one of the first circuit layer patterns (50a) exposed therein, as shown in FIG. 3M. Then, as shown in FIG. 3N, the counter vias (80) on the first side (10a) and second side (10b) of the substrate (10) are filled with a conductive adhesive layer (82), and the bulged objects (82a) are removed before the conductive adhesive layer (82) is cured and hardened, as shown on FIG. 3O. The conductive adhesive layer is formed by vacuum printing, double side printing, or printing in addition to roller coating. Next, the second release film (21) is removed, as shown in FIG. 3P.

Figure 3Q:
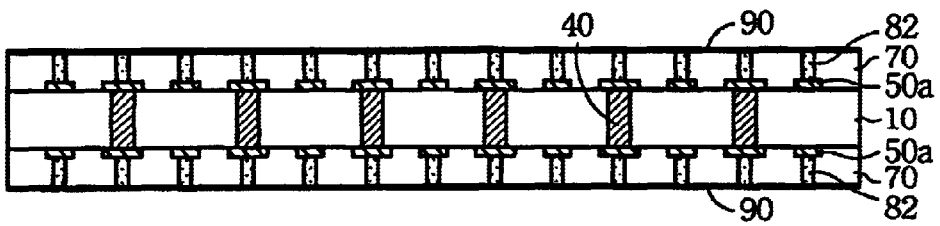
Figure 3R:
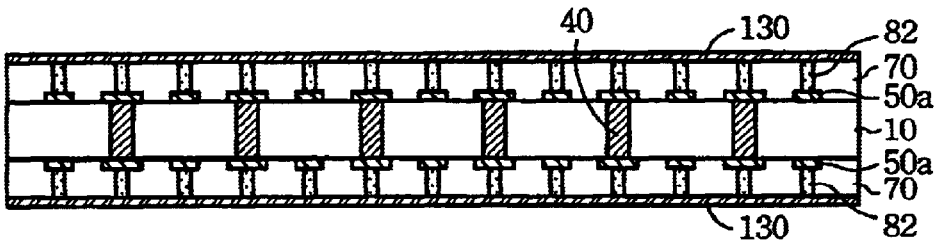

Referring to FIG. 3Q, a copper seed layer (90) is then formed on the build-up layers (70) on the first side (10a) and second side (10b) of the substrate (10) through sputtering, chemical CU plating, or direct plating. After that, a second copper film (130) is formed on the copper seed layer (90) by plating, as shown in FIG. 3R.

Figure 3S:
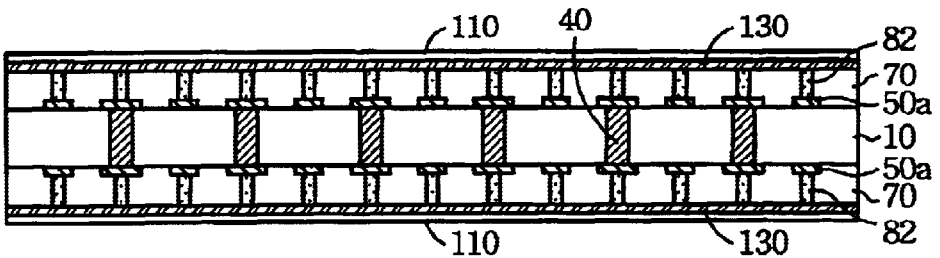
Figure 3T:
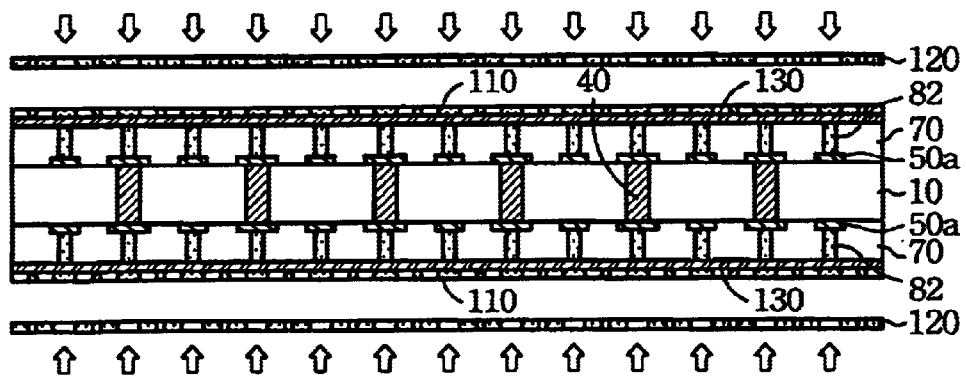
Figure 3U:
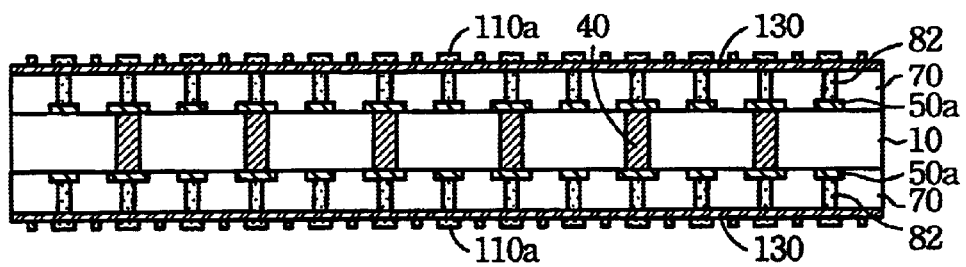

Referring to FIG. 3S, a photo resistant layer (110) is formed on the first side (10a) and second side (10b) of the substrate (10). Next, a photo mask (120) is used to perform exposure operations during the photolithography processes, as shown in FIG. 3T. A chemical developing solution is then applied to perform development during the photolithography processes, as shown in FIG. 3U, to form photo resistant patterns (110a) of a second circuit layer, as shown in FIG. 3U.

Figure 3V:
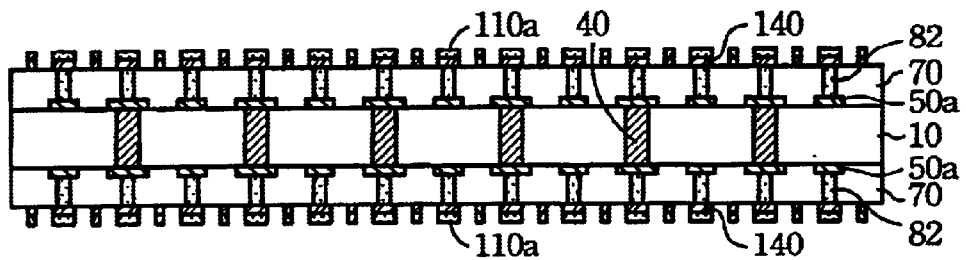
Figure 3W:
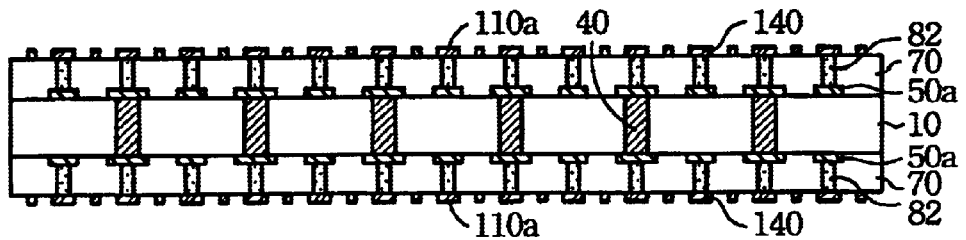

Next, the second copper film (130) is etched to form second circuit layer patterns (140), as shown in FIG. 3V. Finally, the photo resistant patterns (110a) are removed, as shown in FIG. 3W.

Figure 3X:
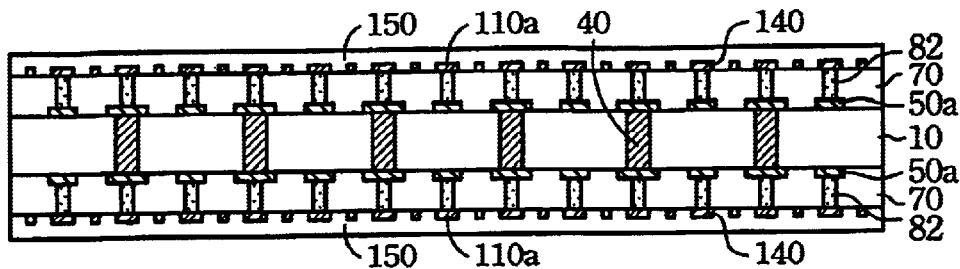
Figure 3Y:
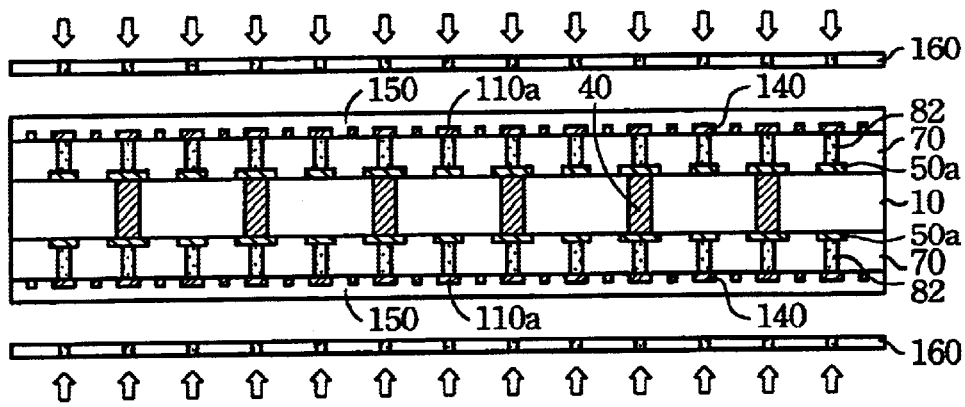
Figure 3Z:
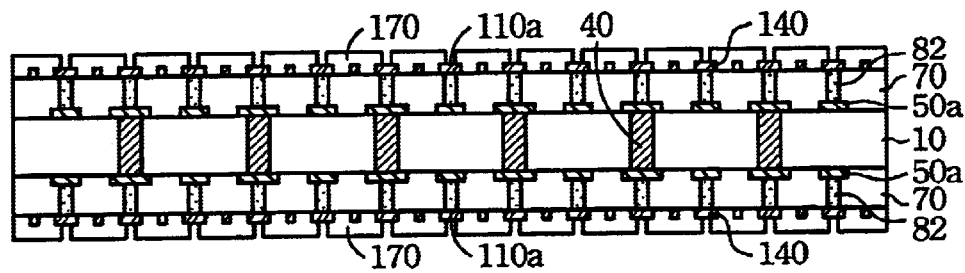
Figure 3A:
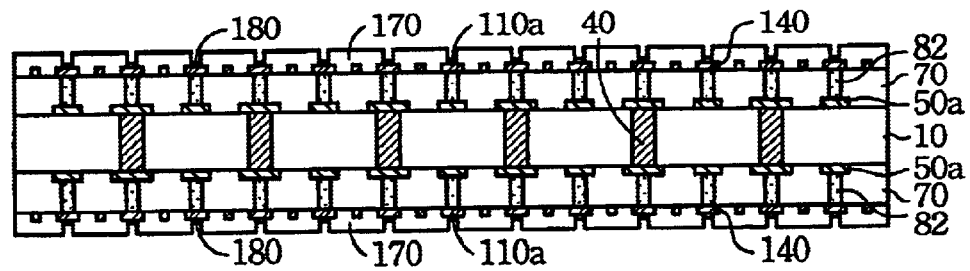

Refer to FIGS. 3X through 3M for the manufacturing processes of forming contact pads on the first side (10a) and second side (10b) of the substrate (10). As shown in FIG. 3X, a solder mask (150) is formed on the first side (10a) and second side (10b) of the substrate (10). A photo mask (160) is then used to perform exposure operations during the photolithography processes, as shown in FIG. 3Y, and a chemical developing solution is applied to perform development operations during the photolithography processes, as shown in FIG. 3Z, to form contact pad patterns (170) which expose a portion of the second circuit layer patterns (140). Finally, plate the exposed second circuit layer patterns (140) with a nickel/gold alloy to form contact pads (180), as shown in FIG. 3AA. The manufacturing processes of the third embodiment of the invention are now complete.

The methods for manufacturing multi-layer package substrates disclosed in the invention can provide the following benefits:

1. During the plugging process, the substrate is protected by the first release film, hence the bulged objects incurred during the plugging process may be easily removed. Thus, not only the consumption of the conductive material decreases, stress that might otherwise incur to the substrate can also be prevented. As a result, the possibility of incurring fractures to the substrate during the plugging process can be greatly reduced, and the production yield can be increased.

2. Transmission methods employed in the equipment of the invention may be Roll to Roll or Reel to Reel, the substrates being used may have a widths of 60 cm or 16 cm. Production processes may be made automatic, integrated and consistent.

3. The invention utilizes fine line (20 microns) manufacturing processes, and can provide a much bigger circuit configuration area.

4. The invention utilizes a conductive material to fill through holes, and the plating processes for the through holes may be dispensed with, and can achieve conductivity from top to bottom.

5. The invention employs laser drilling techniques to make blind holes or counter vias which may have a diameter of 50 microns. As a result, circuit configuration areas can also be greatly increased.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments that do not depart from the spirit and scope of the invention.

What is claimed is:

1. A method for manufacturing multi-layer package substrates, comprising the steps of:

a) providing a substrate that has a first side and a second side which are respectively laminated to a first release film;

b) drilling said substrate bonded to said first release film to form a plurality of through holes;

c) plugging said plurality of through holes with a conductive material and forming bulged objects on said substrate, and removing said bulged objects before said conductive material is cured and hardened;

d) removing said first release film;

e) forming a first copper film on said first side and said second side of said substrate;

f) performing first photolithography and etching processes on said first copper film to form a plurality of first circuit layer patterns on said first side and said second side of said substrate;

g) coating said first side and said second side of said substrate to form build-up layer;

h) drilling said build-up layers through means of a laser to form a plurality of counter vias on said first side and said second side of the substrate, each of said plurality of counter vias exposing one of the plurality of first circuit layer patterns;

i) forming a copper seed layer on the inner surfaces of said plurality of counter vias, the surfaces of said plurality of first circuit layer patterns and the surfaces of said build-up layers;

j) performing second photolithography and etching processes on said copper seed layer to form second circuit layer patterns; and k) forming contact pads on said second circuit layer patterns.

2. The method of claim 1, wherein said performing step j), for forming said second circuit layer patterns comprises the steps of:

j1) forming a copper layer on said copper seed layer by a first plating process;

j2) forming a photo resistant layer on said copper layer;

j3) forming photo resistant patterns through a third photolithography process;

j4) forming a second copper film among the photo resistant patterns on said first side and said second side of said substrate through a second plating process, said second copper film filling said plurality of counter vias;

j5) removing said photo resistant patterns; and j6) etching said second copper films to form said second circuit layer patterns.

3. The method of claim 2, wherein the forming contact pads step k) comprises the sub-steps of:

k1) forming a solder mask on said copper layer and said second circuit layer patterns on said first side and said second side of said substrate;

k2) performing a fourth photolithography process on said solder masks to form contact pad patterns which expose a portion of said second circuit layer patterns; and k3) forming said contact pads on said exposed second circuit layer patterns through third plating process.

4. The method of claim 3, wherein said third plating process for forming said contact pads utilizes a nickel/gold alloy.

5. The method of claim 1, wherein said first release film is made from a PET acrylic resin that has an affinity property with said substrate and is easily separated.

6. The method of claim 1, wherein said first release film has a thickness ranging from 10 to 20 microns.

7. The method of claim 1, wherein said build-up layers are made from Thermal Plastic Polyimide (TPI).

8. The method of claim 1, wherein said copper seed layer formed on said inner surfaces of the plurality of counter vias step j) is formed by a sputtering process.

9. The method of claim 1, wherein said copper seed layer formed on said inner surfaces of the plurality of counter vias step i) is formed by a first chemical plating process.

10. The method of claim 1, wherein said forming step i) comprises a plating copper process after said copper seed layer is formed on said inner surfaces of said plurality of counter vias.

11. The method of claim 1, wherein said performing step j) for forming said second circuit layer patterns comprises the sub-steps of:

j1) forming a second copper film on said copper seed layers through a fourth plating process;

j2) forming a photo resistant layer on said second copper film;

j3) forming photo resistant patterns through a fourth photolithography process;

j4) forming said second circuit layer patterns on said second copper film through a third etching process; and j5) removing said photo resistant patterns.

12. The method of claim 1, wherein th forming contact pads step k) comprises the sub-steps of:

k1) forming a solder mask on said copper seed layer and said second circuit layer patterns on said first side and said second side of said substrate;

k2) performing a sixth photolithography process on said solder masks to form contact pad patterns which expose a portion of said second circuit layer patterns; and k1) forming said contact pads on said exposed second circuit layer patterns through fifth plating process.

13. The method of claim 12, wherein said fifth plating process for forming the contact pads utilizes a nickel/gold alloy.

14. The method of claim 12, wherein said copper seed layer formed on said inner surfaces of said plurality of counter vias is formed by a second chemical Cu plating process.

15. The method of claim 1 wherein the step of coating g) further comprises a step of bonding respectively a second release film on said build-up layers after said build-up layers have been formed.

16. The method of claim 15, wherein said performing step j) for forming the second circuit layer patterns comprises the steps of:

j1) forming a conductive bonding layer on said first side and said second side of said substrate to fill the plurality of counter vias, and forming bulged objects on said conductive bonding layers;

j2) removing said bulged objects from said conductive bonding layer before said conductive bonding layers are cured and hardened;

j3) removing said second release films;

j4) forming a second copper film on said copper seed layers through a sixth plating process;

j5) forming photo resistant patterns through a seventh photolithography process;

j6) performing a fourth etching process on said second copper film to form said second circuit layer patterns; and j7) removing said photo resistant patterns.

17. The method of claim 16, wherein the forming contact pads step k) comprises the steps of:

k1) forming respectively a solder mask on said copper layer and said second circuit layer patterns on said first side and said second side of said substrate;

k2) performing a eighth photolithography process on said solder masks to form contact pad patterns which expose a portion of the second circuit layer patterns; and k3) forming said contact pads on said exposed second circuit layer patterns through a seventh plating process.

18. The method of claim 17, wherein said conductive bonding layer is formed by vacuum printing.

19. The method of claim 17, wherein said conductive bonding layer is formed by double side printing.

20. The method of claim 17, wherein said conductive bonding layer is formed by roller coating and printing.

* * * * *